United States Patent
Jung et al.

(10) Patent No.: US 12,081,058 B2
(45) Date of Patent: Sep. 3, 2024

(54) METHOD AND APPARATUS FOR CHARGING BATTERY

(71) Applicants: Samsung Electronics Co., Ltd., Suwon-si (KR); Samsung SDI Co., Ltd., Yongin-si (KR)

(72) Inventors: Daeryong Jung, Seoul (KR); Duk Jin Oh, Seoul (KR); Jinho Kim, Yongin-si (KR)

(73) Assignees: SAMSUNG ELECTRONICS CO., LTD., Suwon-si (KR); SAMSUNG SDI CO., LTD., Yongin-si (KR)

( * ) Notice: Subject to any disclaimer, the term of this patent is extended or adjusted under 35 U.S.C. 154(b) by 726 days.

(21) Appl. No.: 16/843,238

(22) Filed: Apr. 8, 2020

(65) Prior Publication Data
US 2021/0066945 A1    Mar. 4, 2021

(30) Foreign Application Priority Data

Sep. 4, 2019    (KR) ........................ 10-2019-0109630

(51) Int. Cl.
*G01R 31/367*     (2019.01)
*G01R 31/374*     (2019.01)
(Continued)

(52) U.S. Cl.
CPC ........ *H02J 7/00712* (2020.01); *G01R 31/367* (2019.01); *G01R 31/374* (2019.01);
(Continued)

(58) Field of Classification Search
CPC .. H02J 7/00712; H02J 7/0048; G01R 31/367; G01R 31/374; G01R 31/382; G01R 31/392; H01M 10/052; H01M 10/44
(Continued)

(56) References Cited

U.S. PATENT DOCUMENTS

| | | | | |
|---|---|---|---|---|
| 7,879,485 B2 * | 2/2011 | Yoon | ................. | H01M 50/529 |
| | | | | 429/178 |
| 8,106,625 B2 * | 1/2012 | Takaishi | ............ | G06K 19/0723 |
| | | | | 320/108 |

(Continued)

FOREIGN PATENT DOCUMENTS

| | | |
|---|---|---|
| EP | 3 273 523 A1 | 1/2018 |
| EP | 3 506 452 A1 | 7/2019 |

(Continued)

OTHER PUBLICATIONS

"A holistic aging model for LI(NiMnCo)O2 based 18650 lithium-ion batteries," Schmalstieg et al., Journal of Power Sources, published 2014, pp. 325-334, accessed online Aug. 27, 22, https://www.sciencedirect.com/science/article/pii/S0378775314001876 (Year: 2014).*

(Continued)

*Primary Examiner* — John T Trischler
(74) *Attorney, Agent, or Firm* — NSIP Law

(57) ABSTRACT

A method and apparatus for charging a battery that estimates an aging mode of the battery that reflects an aging factor and an aging degree of the battery based on a battery characteristic corresponding to a charging level of the battery, updates a battery model based on the aging mode, and charges the battery using the updated battery model.

26 Claims, 11 Drawing Sheets

US 12,081,058 B2

Page 2

(51) Int. Cl.
*G01R 31/382* (2019.01)
*G01R 31/392* (2019.01)
*H01M 10/052* (2010.01)
*H01M 10/44* (2006.01)
*H01M 10/48* (2006.01)
*H02J 7/00* (2006.01)
*H01M 10/42* (2006.01)

(52) U.S. Cl.
CPC ......... *G01R 31/382* (2019.01); *G01R 31/392* (2019.01); *H01M 10/052* (2013.01); *H01M 10/44* (2013.01); *H01M 10/48* (2013.01); *H02J 7/0048* (2020.01); *H01M 2010/4271* (2013.01); *H01M 10/446* (2013.01)

(58) Field of Classification Search
USPC ......................................................... 320/162
See application file for complete search history.

(56) References Cited

U.S. PATENT DOCUMENTS

| | | | | |
|---|---|---|---|---|
| 8,117,857 B2* | 2/2012 | Kelty | B60L 58/16 62/244 |
| 8,508,191 B2* | 8/2013 | Kim | H02J 7/0024 320/132 |
| 8,618,775 B2* | 12/2013 | Hermann | H01M 10/60 361/87 |
| 8,624,560 B2* | 1/2014 | Ungar | H01M 4/5815 320/152 |
| 8,749,201 B2* | 6/2014 | Skelton | H02J 7/005 320/132 |
| 8,899,492 B2* | 12/2014 | Kelty | B60L 58/16 320/150 |
| 8,961,203 B2* | 2/2015 | Lee | H01R 13/64 439/142 |
| 8,972,213 B2* | 3/2015 | Zhang | G01R 31/392 702/65 |
| 9,217,779 B2* | 12/2015 | Xu | G01R 31/3842 |
| 9,236,748 B2* | 1/2016 | Barsukov | H02J 7/00714 |
| 9,257,729 B2* | 2/2016 | Hermann | B60L 3/0046 |
| 9,360,531 B2* | 6/2016 | Suh | G01R 31/367 |
| 9,397,516 B2* | 7/2016 | Hunter | H02J 7/007194 |
| 9,461,490 B2* | 10/2016 | Ying | G01R 31/3828 |
| 9,625,532 B2* | 4/2017 | Gering | G01R 31/392 |
| 9,643,508 B2* | 5/2017 | Boehm | H01M 10/4257 |
| 9,714,984 B2* | 7/2017 | Kim | G01R 31/392 |
| 9,720,478 B2* | 8/2017 | Hanafusa | H02J 13/00002 |
| 9,746,523 B2* | 8/2017 | Boehm | H01M 10/482 |
| 9,864,017 B2* | 1/2018 | Tao | H01M 10/48 |
| 9,897,664 B2* | 2/2018 | You | G01R 31/367 |
| 9,960,625 B2* | 5/2018 | Klein | B60L 58/10 |
| 10,044,213 B2* | 8/2018 | Barsukov | H02J 7/00 |
| 10,090,686 B2* | 10/2018 | Suzuki | G01R 31/374 |
| 10,107,865 B2* | 10/2018 | Choi | G01R 31/367 |
| 10,140,585 B2* | 11/2018 | Fife | H02J 3/28 |
| 10,180,464 B2* | 1/2019 | Saint-Marcoux | G01R 31/392 |
| 10,196,053 B2* | 2/2019 | Delobel | B60L 58/16 |
| 10,209,313 B2* | 2/2019 | Abe | G01R 31/392 |
| 10,263,447 B2* | 4/2019 | MirTabatabaei | H02J 7/0048 |
| 10,302,704 B2* | 5/2019 | Hariharan | G01R 31/392 |
| 10,338,146 B2* | 7/2019 | Hametner | G01R 31/392 |
| 10,338,153 B2* | 7/2019 | Adagouda Patil | G01R 31/367 |
| 10,345,390 B2* | 7/2019 | Lee | G01R 31/392 |
| 10,353,008 B2* | 7/2019 | Benosman | G01R 31/367 |
| 10,393,813 B2* | 8/2019 | Sun | H02J 7/005 |
| 10,395,196 B2* | 8/2019 | Fife | G05F 1/66 |
| 10,401,433 B2* | 9/2019 | Chow | B60L 58/12 |
| 10,410,153 B2* | 9/2019 | Fife | G01R 31/392 |
| 10,422,835 B2* | 9/2019 | Kani | G01R 31/367 |
| 10,422,837 B2* | 9/2019 | Park | G01R 31/367 |
| 10,444,292 B2* | 10/2019 | Park | G01R 31/396 |
| 10,459,034 B2* | 10/2019 | Basu | G01R 31/367 |
| 10,466,304 B2* | 11/2019 | Sung | B60L 58/12 |
| 10,489,731 B2* | 11/2019 | Fife | G05B 13/041 |
| 10,534,039 B2* | 1/2020 | Seo | G01R 31/382 |
| 10,539,621 B2* | 1/2020 | Chow | G01R 31/367 |
| 10,566,811 B2* | 2/2020 | Howey | H01M 10/42 |
| 10,566,818 B2* | 2/2020 | Jung | H02J 7/0048 |
| 10,566,819 B2* | 2/2020 | Barsukov | H02J 7/00 |
| 10,592,833 B2* | 3/2020 | Fife | G06Q 30/0206 |
| 10,598,735 B2* | 3/2020 | Lee | G01R 31/367 |
| 10,663,522 B2* | 5/2020 | You | B60L 58/15 |
| 10,718,815 B2* | 7/2020 | Kim | H01M 10/48 |
| 10,720,786 B2* | 7/2020 | Jung | H01M 10/44 |
| 10,746,804 B2* | 8/2020 | Park | G01R 31/3842 |
| 10,797,501 B2* | 10/2020 | Jung | H01M 10/46 |
| 10,800,284 B2* | 10/2020 | He | H01M 10/0525 |
| 10,829,004 B1* | 11/2020 | Han | H02J 7/00716 |
| 10,857,895 B2* | 12/2020 | Oh | H02J 7/00714 |
| 10,892,631 B2* | 1/2021 | Barsukov | H02J 7/00 |
| 10,908,219 B2* | 2/2021 | Gorlin | G01R 31/371 |
| 10,921,383 B2* | 2/2021 | Pajovic | G01R 31/367 |
| 10,931,128 B2* | 2/2021 | Basu | H01M 10/48 |
| 10,935,608 B2* | 3/2021 | Song | G01R 31/367 |
| 10,985,588 B2* | 4/2021 | MirTabatabaei | H01M 10/48 |
| 11,002,793 B2* | 5/2021 | Lim | H01M 10/482 |
| 11,017,338 B2* | 5/2021 | Fife | G06Q 30/0206 |
| 11,088,558 B2* | 8/2021 | Jung | H02J 7/0071 |
| 11,139,668 B2* | 10/2021 | Jung | H01M 10/425 |
| 11,144,858 B2* | 10/2021 | Fife | G05F 1/66 |
| 11,187,757 B2* | 11/2021 | Yoon | G01R 31/3648 |
| 11,199,588 B2* | 12/2021 | Kandler | G06N 7/01 |
| 11,215,674 B2* | 1/2022 | Markochev | G01R 31/367 |
| 11,251,472 B2* | 2/2022 | Gorlin | H01M 10/44 |
| 11,283,103 B2* | 3/2022 | Hong | H01M 10/0525 |
| 11,293,988 B2* | 4/2022 | Kim | G01R 31/3648 |
| 11,300,623 B2* | 4/2022 | Badwekar | G01R 31/392 |
| 11,342,596 B2* | 5/2022 | Flueckiger | G01R 31/367 |
| 11,353,516 B2* | 6/2022 | Lee | G01R 31/392 |
| 11,368,034 B2* | 6/2022 | Jung | H02J 7/005 |
| 11,402,433 B2* | 8/2022 | Naha | G01R 31/389 |
| 11,415,630 B2* | 8/2022 | Dubarry | G01R 31/3842 |
| 11,462,774 B2* | 10/2022 | Zhang | H01M 10/44 |
| 11,848,426 B2* | 12/2023 | Zhang | H02J 7/0047 |
| 2003/0184307 A1* | 10/2003 | Kozlowski | B60L 58/16 324/427 |
| 2006/0251960 A1* | 11/2006 | Yoon | H01M 50/244 429/178 |
| 2009/0273320 A1* | 11/2009 | Ungar | H02J 7/007194 320/162 |
| 2009/0326841 A1* | 12/2009 | Zhang | G01R 31/367 706/20 |
| 2010/0052430 A1* | 3/2010 | Takaishi | G06K 19/07777 307/104 |
| 2010/0212339 A1* | 8/2010 | Kelty | B60L 58/26 62/157 |
| 2011/0025258 A1* | 2/2011 | Kim | H01M 10/425 320/128 |
| 2011/0060538 A1* | 3/2011 | Fahimi | G01R 31/392 702/63 |
| 2011/0196633 A1* | 8/2011 | Abe | G01R 31/367 702/63 |
| 2012/0007556 A1* | 1/2012 | Matsui | B60L 58/18 320/112 |
| 2012/0021258 A1* | 1/2012 | Kelty | H01M 10/625 429/50 |
| 2012/0081075 A1* | 4/2012 | Skelton | H01M 10/4207 180/65.29 |
| 2012/0098481 A1* | 4/2012 | Hunter | H02J 7/00712 703/13 |
| 2012/0226455 A1* | 9/2012 | Kumashiro | H01M 10/48 702/63 |
| 2012/0262126 A1* | 10/2012 | Boehm | H01M 10/4257 320/162 |
| 2013/0085696 A1* | 4/2013 | Xu | G06F 17/40 702/63 |
| 2013/0090900 A1* | 4/2013 | Gering | G01R 31/392 703/2 |
| 2013/0096858 A1* | 4/2013 | Amano | G01R 31/367 702/63 |

(56) References Cited

U.S. PATENT DOCUMENTS

| | | | |
|---|---|---|---|
| 2013/0166233 A1* | 6/2013 | Suh | G01R 31/382 702/63 |
| 2013/0179012 A1* | 7/2013 | Hermann | B60L 58/15 700/275 |
| 2013/0207462 A1* | 8/2013 | Boehm | B60L 58/10 429/90 |
| 2013/0278221 A1* | 10/2013 | Maeda | G01R 31/392 320/134 |
| 2014/0009123 A1* | 1/2014 | Park | G01R 31/392 320/152 |
| 2014/0032141 A1* | 1/2014 | Subbotin | H01M 10/42 702/63 |
| 2014/0062415 A1* | 3/2014 | Barsukov | H02J 7/00719 320/152 |
| 2014/0065859 A1* | 3/2014 | Lee | H01R 13/64 439/135 |
| 2014/0088809 A1* | 3/2014 | Hermann | B60L 58/13 429/61 |
| 2014/0089692 A1* | 3/2014 | Hanafusa | G01R 31/367 713/310 |
| 2014/0232411 A1* | 8/2014 | Vaidya | G01R 31/3842 324/426 |
| 2014/0278169 A1* | 9/2014 | Kim | G01R 31/3835 702/63 |
| 2015/0066406 A1* | 3/2015 | Sun | B60L 3/12 702/63 |
| 2015/0219726 A1* | 8/2015 | Lenz | G01R 31/382 702/63 |
| 2015/0268307 A1* | 9/2015 | Inguva | G01R 31/392 702/63 |
| 2015/0268309 A1* | 9/2015 | Kim | G01R 31/392 324/432 |
| 2015/0301122 A1* | 10/2015 | Lee | G01R 31/392 702/63 |
| 2015/0362559 A1* | 12/2015 | Hametner | G01R 31/3828 702/63 |
| 2015/0377974 A1* | 12/2015 | Choi | G01R 31/367 702/63 |
| 2016/0033582 A1* | 2/2016 | You | G01R 31/374 324/426 |
| 2016/0041231 A1* | 2/2016 | Lee | G01R 31/367 702/63 |
| 2016/0061908 A1* | 3/2016 | Torai | G01R 31/389 702/63 |
| 2016/0131715 A1* | 5/2016 | Sung | G01R 31/382 702/63 |
| 2016/0134146 A1* | 5/2016 | Ling | H01M 10/44 320/136 |
| 2016/0187428 A1* | 6/2016 | Basu | G01R 31/367 702/63 |
| 2016/0187432 A1* | 6/2016 | Saint-Marcoux | G01R 31/392 702/63 |
| 2016/0209472 A1* | 7/2016 | Chow | G01R 31/367 |
| 2016/0259014 A1* | 9/2016 | Adagouda Patil | G01R 31/392 |
| 2016/0363632 A1* | 12/2016 | Park | G01R 31/396 |
| 2017/0005488 A1* | 1/2017 | Suzuki | B60L 58/12 |
| 2017/0010327 A1* | 1/2017 | Nishiguchi | G01R 31/3835 |
| 2017/0052228 A1* | 2/2017 | Hariharan | G01R 31/3842 |
| 2017/0070061 A1* | 3/2017 | Barsukov | H02J 7/00712 |
| 2017/0102436 A1* | 4/2017 | Tao | G01R 31/392 |
| 2017/0115358 A1* | 4/2017 | Kani | G01R 31/367 |
| 2017/0123009 A1* | 5/2017 | You | G01R 31/392 |
| 2017/0194669 A1* | 7/2017 | Christensen | H01M 10/4257 |
| 2017/0203667 A1* | 7/2017 | He | B60L 58/21 |
| 2017/0205468 A1* | 7/2017 | Park | G01R 31/396 |
| 2017/0205469 A1* | 7/2017 | Song | G01R 31/367 |
| 2017/0222449 A1* | 8/2017 | MirTabatabaei | H02J 7/0071 |
| 2017/0285111 A1* | 10/2017 | Fife | G01R 31/382 |
| 2017/0285587 A1* | 10/2017 | Fife | G01R 31/392 |
| 2017/0285678 A1* | 10/2017 | Fife | H02J 13/00028 |
| 2017/0286882 A1* | 10/2017 | Fife | H02J 3/00 |
| 2017/0288399 A1* | 10/2017 | Fife | G05B 13/048 |
| 2017/0288414 A1* | 10/2017 | Klein | H01M 10/48 |
| 2017/0288455 A1* | 10/2017 | Fife | G05B 13/021 |
| 2017/0369048 A1* | 12/2017 | Delobel | B60W 20/00 |
| 2018/0031642 A1* | 2/2018 | Sung | G01R 31/367 |
| 2018/0059192 A1* | 3/2018 | Seo | G01R 31/374 |
| 2018/0095140 A1* | 4/2018 | Park | G01R 31/367 |
| 2018/0100898 A1* | 4/2018 | Benosman | B60L 58/15 |
| 2018/0104762 A1* | 4/2018 | Kadoya | B23K 31/00 |
| 2018/0106868 A1* | 4/2018 | Sung | B60L 3/12 |
| 2018/0143254 A1* | 5/2018 | Kim | G01R 31/367 |
| 2018/0145531 A1* | 5/2018 | Jung | H02J 7/0071 |
| 2018/0198300 A1* | 7/2018 | Howey | H01M 10/045 |
| 2018/0203070 A1* | 7/2018 | Park | H01M 10/48 |
| 2018/0316204 A1* | 11/2018 | Basu | H02J 7/005 |
| 2018/0321323 A1* | 11/2018 | Dubarry | G01R 31/392 |
| 2019/0006871 A1* | 1/2019 | Barsukov | H02J 7/00712 |
| 2019/0036356 A1* | 1/2019 | Subbaraman | G01R 31/367 |
| 2019/0041464 A1* | 2/2019 | Chow | G01R 31/392 |
| 2019/0042992 A1* | 2/2019 | Fife | G05B 13/048 |
| 2019/0086478 A1* | 3/2019 | Park | G01R 31/392 |
| 2019/0109466 A1* | 4/2019 | MirTabatabaei | H01M 10/48 |
| 2019/0123574 A1* | 4/2019 | Jung | B60L 58/12 |
| 2019/0170827 A1* | 6/2019 | Shoa Hassani Lashidani | H02J 7/0068 |
| 2019/0190277 A1* | 6/2019 | Jung | H01M 10/46 |
| 2019/0195956 A1* | 6/2019 | Lim | H01M 10/425 |
| 2019/0202299 A1* | 7/2019 | Oh | H01M 10/425 |
| 2019/0229378 A1* | 7/2019 | Zhang | H01M 10/486 |
| 2019/0340555 A1* | 11/2019 | Fife | H02J 3/46 |
| 2019/0346513 A1* | 11/2019 | Markochev | G01R 31/392 |
| 2020/0005208 A1* | 1/2020 | Fife | H02J 13/00 |
| 2020/0006816 A1* | 1/2020 | Gorlin | H01M 10/48 |
| 2020/0103469 A1* | 4/2020 | Jung | G01R 31/367 |
| 2020/0108461 A1* | 4/2020 | Kadoya | B23K 11/241 |
| 2020/0116793 A1* | 4/2020 | Kandler | G01R 31/382 |
| 2020/0136173 A1* | 4/2020 | Hong | H02J 7/00 |
| 2020/0144833 A1* | 5/2020 | Barsukov | H02J 7/00 |
| 2020/0150185 A1* | 5/2020 | Ramezan Pour Safaei | H02J 7/0071 |
| 2020/0203780 A1* | 6/2020 | Mandli | H01M 10/4285 |
| 2020/0210541 A1* | 7/2020 | Han | H01M 10/4207 |
| 2020/0227791 A1* | 7/2020 | Flueckiger | H01M 10/425 |
| 2020/0264237 A1* | 8/2020 | Lee | G01R 31/396 |
| 2020/0284846 A1* | 9/2020 | Pajovic | G06N 20/00 |
| 2020/0313152 A1* | 10/2020 | Stefanopoulou | B60L 58/12 |
| 2020/0335993 A1* | 10/2020 | Jung | B60L 58/12 |
| 2020/0341067 A1* | 10/2020 | Ruan | H01M 10/425 |
| 2020/0355750 A1* | 11/2020 | Badwekar | G01R 31/367 |
| 2020/0363475 A1* | 11/2020 | Han | G01R 31/382 |
| 2020/0371161 A1* | 11/2020 | Gorlin | H01M 10/44 |
| 2020/0403417 A1* | 12/2020 | Jung | H02J 7/007 |
| 2021/0053450 A1* | 2/2021 | Oh | H02J 7/00714 |
| 2021/0063490 A1* | 3/2021 | Naha | G01R 31/392 |
| 2021/0116510 A1* | 4/2021 | Kim | G01R 31/3842 |
| 2021/0132151 A1* | 5/2021 | Lee | G06N 3/04 |
| 2021/0148985 A1* | 5/2021 | Yoon | G01R 31/374 |
| 2021/0181263 A1* | 6/2021 | Hametner | G01R 31/374 |
| 2021/0239766 A1* | 8/2021 | Talukdar | G01R 31/389 |
| 2021/0242698 A1* | 8/2021 | Kaushik | H02J 7/00716 |
| 2021/0247460 A1* | 8/2021 | Guha | G01R 31/392 |
| 2021/0249702 A1* | 8/2021 | Murphy | H01M 10/486 |
| 2021/0255246 A1* | 8/2021 | Han | G01R 31/382 |
| 2021/0311129 A1* | 10/2021 | Yezerets | G01R 31/392 |
| 2022/0011374 A1* | 1/2022 | Vinit | G01R 31/3832 |
| 2022/0014026 A1* | 1/2022 | Jung | G01R 31/382 |
| 2022/0045534 A1* | 2/2022 | Hoyt | H02J 7/005 |
| 2022/0065934 A1* | 3/2022 | Kim | G01R 31/367 |
| 2022/0074995 A1* | 3/2022 | Bharathraj | G01R 31/367 |
| 2022/0115875 A1* | 4/2022 | Jung | B60L 58/16 |
| 2022/0138653 A1* | 5/2022 | Fife | G06Q 50/06 700/287 |
| 2022/0149645 A1* | 5/2022 | Ramanujam | B60L 3/12 |
| 2022/0185139 A1* | 6/2022 | Kroener | B60L 53/66 |
| 2022/0200293 A1* | 6/2022 | Lee | H02J 7/005 |
| 2022/0221516 A1* | 7/2022 | Lee | G01R 31/389 |
| 2022/0229121 A1* | 7/2022 | Fan | G01R 31/367 |
| 2022/0239122 A1* | 7/2022 | Baumann | H02J 7/005 |
| 2022/0252670 A1* | 8/2022 | Xu | G01R 31/367 |
| 2022/0252674 A1* | 8/2022 | Xu | G01R 31/3828 |
| 2023/0003801 A1* | 1/2023 | Oh | H02J 7/00032 |

(56) References Cited

U.S. PATENT DOCUMENTS

| | | | | |
|---|---|---|---|---|
| 2023/0040026 A1* | 2/2023 | Zhang | ............... | H01M 10/0525 |
| 2023/0132491 A1* | 5/2023 | Kang | ................... | G06Q 10/30 |
| | | | | 324/76.11 |
| 2023/0152387 A1* | 5/2023 | Kang | ................... | H01M 10/48 |
| | | | | 701/31.9 |
| 2023/0258734 A1* | 8/2023 | Lee | ..................... | G01R 31/371 |
| | | | | 702/63 |
| 2023/0273266 A1* | 8/2023 | Okubo | ............... | G01R 31/3648 |
| | | | | 702/63 |
| 2023/0314528 A1* | 10/2023 | Sowa | .................. | G01R 31/367 |
| | | | | 702/63 |
| 2023/0393206 A1* | 12/2023 | Park | ................. | H01M 10/4285 |
| 2024/0110984 A1* | 4/2024 | Park | ................. | G01R 31/3648 |
| 2024/0120558 A1* | 4/2024 | Zhang | ................. | H01M 10/425 |

FOREIGN PATENT DOCUMENTS

| | | |
|---|---|---|
| JP | 2018-50405 A | 3/2018 |
| JP | 2018-059910 A | 4/2018 |
| JP | 2018-205139 A | 12/2018 |
| KR | 10-2017-0085365 A | 7/2017 |
| KR | 10-1867225 B1 | 6/2018 |
| WO | WO 2019/053131 A1 | 3/2019 |

OTHER PUBLICATIONS

Extended European Search Report issued on Aug. 6, 2020 in counterpart European Patent Application No. 20175126.0 (10 pages in English).

Japanese Office action issued on Jun. 11, 2024, in counterpart Japanese Patent Application No. 2020-137058 (2 pages in English, 4 pages in Japanese).

\* cited by examiner

100

METHOD AND APPARATUS FOR CHARGING BATTERY

CROSS-REFERENCE TO RELATED APPLICATIONS

This application claims the benefit under 35 USC § 119(a) of Korean Patent Application No. 10-2019-0109630 filed on Sep. 4, 2019 in the Korean Intellectual Property Office, the entire disclosure of which is incorporated herein by reference for all purposes.

BACKGROUND

1. Field

The following description relates to a method and apparatus for charging a battery.

2. Description of Related Art

Batteries are charged using various methods. For example, a constant current-constant voltage charging (CCCV) method charges a battery with constant currents, and charges the battery at a constant voltage when a voltage of the battery reaches a preset level. A varying current decay charging method charges a battery with high currents at a low state of charge (SOC), and gradually reduces the currents when the battery has a predetermined SOC by charging. In addition, a multi-step charging method charges a battery with constant currents (CC) of multiple steps from high current to low current, and a pulse charging method repetitively applies pulse currents at short time intervals.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method of charging a battery includes estimating an aging mode of the battery that reflects an aging factor and an aging degree of the battery based on a battery characteristic corresponding to a charging level of the battery, updating a battery model based on the aging mode, and charging the battery using the updated battery model.

The method may include estimating the aging mode of the battery based on aging modes of one or more reference batteries having different aging factors and/or different aging degrees.

The method may include estimating the aging mode of the battery by applying a weight to each of the aging modes of the selected one or more reference batteries, and determining the weight based on a similarity to the battery characteristic corresponding to the charging level of the battery.

The similarity may indicate a similarity of a peak characteristic shown in a graph of a battery characteristic corresponding to a charging level of the reference battery to a peak characteristic shown in a graph of the battery characteristic corresponding to the charging level of the battery.

The peak characteristic may include at least one characteristic of a position, an intensity, a full width at half maximum (FWHM), and a shape of a peak in the graph of the battery characteristic corresponding to the charging level.

The peak characteristic may be a characteristic of a peak with the lowest charging level, among peaks included in the graph of the battery characteristic corresponding to the charging level.

The aging mode may include an aging factor of the battery aged by an aging history of the battery, and a current aging degree of the battery aged by the aging factor.

The battery characteristic corresponding to the charging level may be expressed by a graph depicted based on a ratio between a change in quantity of electric charge and a change in voltage of the battery, and the charging level of the battery.

The charging level of the battery may include one of a state of charge (SOC), a voltage, and a quantity of electric charge of the battery.

The battery characteristic corresponding to the charging level may correspond to dQ/dV with respect to an SOC, wherein dQ is a change in quantity of electric charge of the battery, and dV is a change in voltage of the battery.

The method may include determining an aging mode previously estimated with respect to the battery to be the aging mode of the battery, in response to an aging mode reuse condition being satisfied.

Determining whether the aging mode reuse condition is satisfied may include one or more of determining whether a time difference, between a last point in time at which the aging mode of the battery was estimated and a current point in time, is less than or equal to a threshold time, and determining whether the usage of the battery after the last point in time is less than or equal to a threshold usage.

The method may include charging the battery using multi-step charging determined based on the updated battery model.

The battery characteristic corresponding to the charging level may be determined based on a charging profile of the battery.

The method may include updating the battery model to reflect the aging factor and the aging degree of the battery corresponding to the aging mode in an internal state of the battery model.

The battery may be a battery cell, a battery module, or a battery pack.

The battery model may be an electrochemical model.

In another general aspect, an apparatus for charging a battery includes a memory configured to store a battery model, and a processor configured to estimate an aging mode of the battery that reflects an aging factor and an aging degree of the battery based on a battery characteristic corresponding to a charging level of the battery, update the battery model based on the aging mode, and control charging of the battery using the updated battery model.

In another general aspect, a method of charging a battery includes obtaining a charging profile of a battery including lithium (Li), determining a battery characteristic corresponding to a charging level of the battery based on the charging profile, determining whether the battery is aged by Li plating based on the battery characteristic corresponding to the charging level, updating a battery model by estimating an aging mode of the battery to reflect aging of the battery, in response to a determination that the battery is aged by Li plating, and charging the battery using the updated battery model.

The method may include determining that the battery is aged by Li plating, in a case in which a reference battery principally aged by Li plating, among a plurality of reference batteries having different aging factors and/or different aging degrees, has a battery characteristic most similar to the battery characteristic corresponding to the charging level.

The method may include estimating the aging mode of the battery using an aging mode of the reference battery aged principally by Li plating, and updating the battery model based on the estimated aging mode.

The method may include determining a charging condition of the battery using the updated battery model, and charging the battery based on the determined charging condition.

The battery model may be an electrochemical model.

The method may include updating the electrochemical model by reflecting a decrease in Li capacity at a cathode by Li plating.

In another general aspect, a method includes estimating an aging mode of a target battery by comparing one or more characteristics of the target battery with corresponding characteristics of at least two reference batteries that have been aged principally by different aging factors; and charging the battery using a battery model that is determined based on the estimated aging mode.

The at least two reference batteries may include a first reference battery that has been aged principally by Li plating and a second reference battery that has been aged principally by a cathode capacity decrease and an anode solid electrolyte interphase (SEI) layer.

Other features and aspects will be apparent from the following detailed description, the drawings, and the claims.

Figure 1:
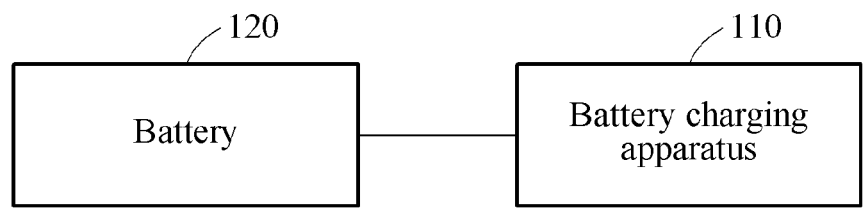
FIG. 1 illustrates an example of a battery charging system.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed structural or functional description is provided as an example only and various alterations and modifications may be made to the examples. Accordingly, the examples are not construed as being limited to the disclosure and should be understood to include all changes, equivalents, and replacements within the technical scope of the disclosure.

Terms, such as first, second, and the like, may be used herein to describe components. Each of these terminologies is not used to define an essence, order or sequence of a corresponding component but used merely to distinguish the corresponding component from other component(s). For example, a first component may be referred to as a second component, and similarly the second component may also be referred to as the first component.

It should be noted that if it is described that one component is "connected", "coupled", or "joined" to another component, a third component may be "connected", "coupled", and "joined" between the first and second components, although the first component may be directly connected, coupled, or joined to the second component.

The singular forms "a", "an", and "the" are intended to include the plural forms as well, unless the context clearly indicates otherwise. It will be further understood that the terms "comprises/comprising" and/or "includes/including" when used herein, specify the presence of stated features, integers, steps, operations, elements, and/or components, but do not preclude the presence or addition of one or more other features, integers, steps, operations, elements, components and/or groups thereof.

Unless otherwise defined, all terms, including technical and scientific terms, used herein have the same meaning as commonly understood by one of ordinary skill in the art to which this disclosure pertains. Terms, such as those defined in commonly used dictionaries, are to be interpreted as having a meaning that is consistent with their meaning in the context of the relevant art, and are not to be interpreted in an idealized or overly formal sense unless expressly so defined herein.

Hereinafter, examples are described in detail with reference to the accompanying drawings. The following specific structural or functional descriptions are exemplary to merely describe the examples, and the scope of the examples is not limited to the descriptions provided in the present specification. Various changes and modifications can be made thereto by those of ordinary skill in the art. Like reference numerals in the drawings denote like elements, and a known function or configuration will be omitted herein.

FIG. 1 illustrates an example of a battery charging system.

Referring to FIG. 1, a battery charging system 100 includes a battery charging apparatus 110 and a battery 120.

The battery 120 corresponds to a battery cell, a battery module, or a battery pack.

The battery charging apparatus 110 charges the battery 120 using a battery model. For example, the battery charging apparatus 110 quickly charges the battery 120 using a multi-step charging method for minimizing charging aging by estimating an internal state of the battery based on the battery model. Here, the battery model is an electrochemical model configured to estimate state information of the battery 120 by modeling an internal physical phenomenon, such as a potential or ion concentration distribution, of the battery. Further, the internal state of the battery includes a cathode lithium (Li) ion concentration distribution, an anode Li ion concentration distribution, and/or an electrolyte Li ion concentration distribution of the battery, and an active material includes a cathode and an anode of the battery.

As it is repeatedly used, the battery 120 is aged gradually. An aging state of the battery 120 varies depending on a use history of the battery 120. Thus, the battery model is updated to reflect a state of health (SOH) reduced by the repeated use of the battery 120 and an aging mode that varies depending on the use history of the battery 120. If a battery model not reflecting an aging mode is used, an internal state of the battery model for determining charging limit conditions for quick charging is estimated inaccurately, and the aging conditions are not avoided, which causes drastic aging of the battery and a reduction in life of the battery.

The aging mode reflects an aging factor of the battery 120 aged by an aging history of the battery 120, and a current aging degree of the battery 120 aged by the aging factor. The aging factor includes predetermined aging factors to be reflected in the battery model, for example, a cathode capacity decrease, an anode capacity decrease, a Li ion loss, an electrode surface resistance increase, and an electrode diffusivity change. In general, a battery is aged by a combination of many aging factors. The aging degree indicates an SOH.

Figure 2:
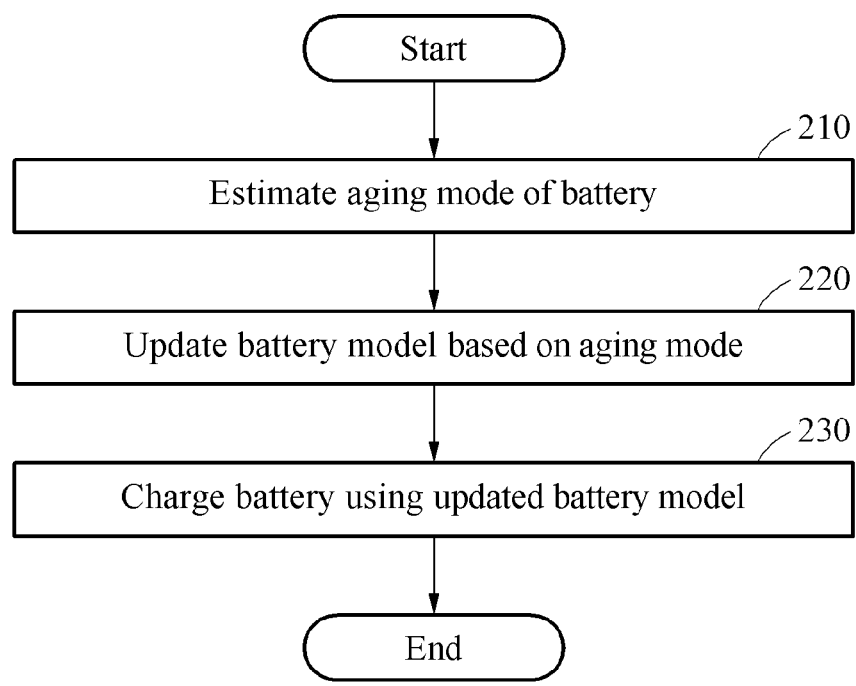
FIG. 2 illustrates an example of a battery charging method.

FIG. 2 illustrates an example of a battery charging method.

Referring to FIG. 2, a battery charging method performed by a processor of a battery charging apparatus is illustrated.

In operation 210, the battery charging apparatus estimates an aging mode of a battery reflecting an aging factor and an aging degree of the battery based on a battery characteristic corresponding to a charging level of the battery. Here, the battery characteristic corresponding to the charging level of the battery is expressed as a graph based on a ratio between a change in quantity of electric charge and a change in voltage of the battery. The charging level of the battery includes one of an SOC, a voltage V, and a quantity of electric charge Q of the battery. For example, the battery characteristic corresponding to the charging level corresponds to dQ/dV with respect to an SOC, wherein dQ denotes a change in quantity of electric charge, and dV denotes a change in voltage. The battery characteristic corresponding to the charging level is determined based on a charging profile of the battery.

The battery charging apparatus estimates the aging mode of the battery based on aging modes of one or more reference batteries selected from a plurality of reference batteries having different aging factors and/or different aging degrees. In this example, when one or more reference batteries are selected, the aging mode of the battery is estimated by applying a weight to each of the aging modes of the selected reference batteries, and the weight is determined based on a similarity to the battery characteristic corresponding to the charging level of the battery. Detailed description thereof will be provided with reference to FIGS. 3 through 5.

In operation 220, the battery charging apparatus updates a battery model based on the aging mode. The battery charging apparatus updates the battery model to reflect the aging factor and the aging degree of the battery corresponding to the aging mode in an internal state of the battery model.

In operation 230, the battery charging apparatus charges the battery using the updated battery model. The battery charging apparatus charges the battery using a multi-step charging method determined based on the updated battery model, for example, an updated electrochemical model.

Figure 3:
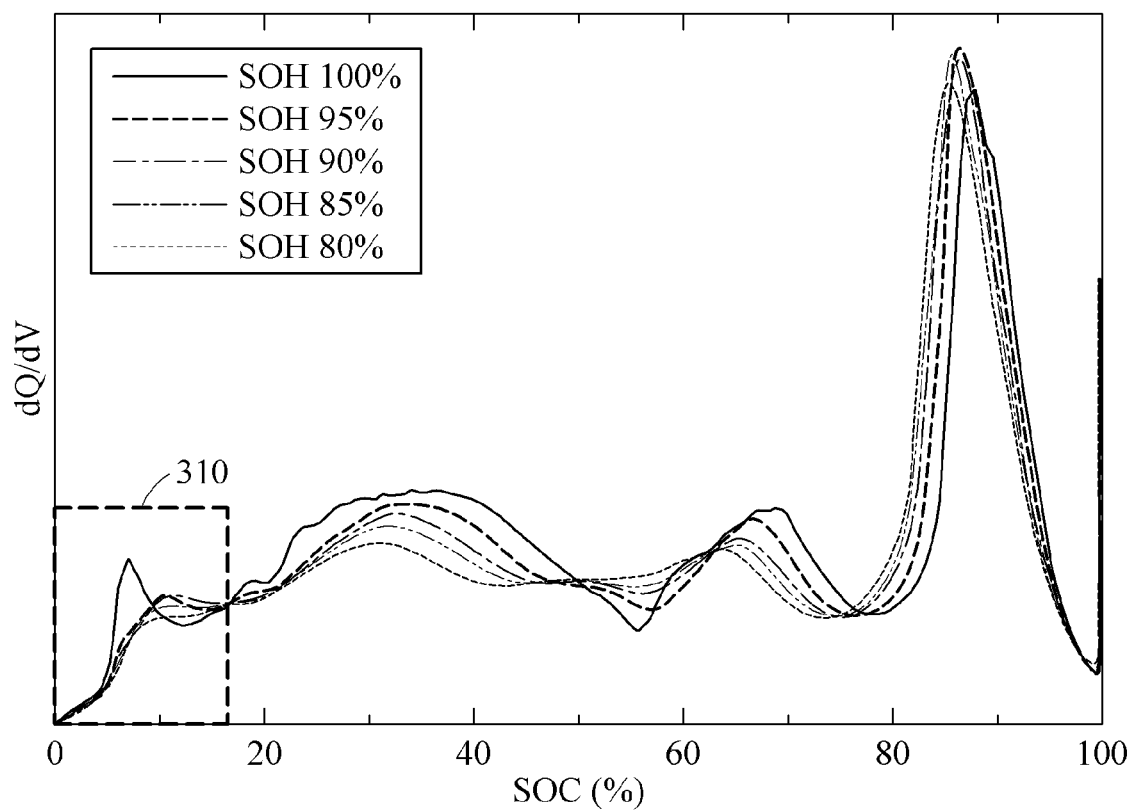
FIGS. 3 and 4 illustrate examples of battery characteristics corresponding to charging levels of a plurality of reference batteries.
Figure 4:
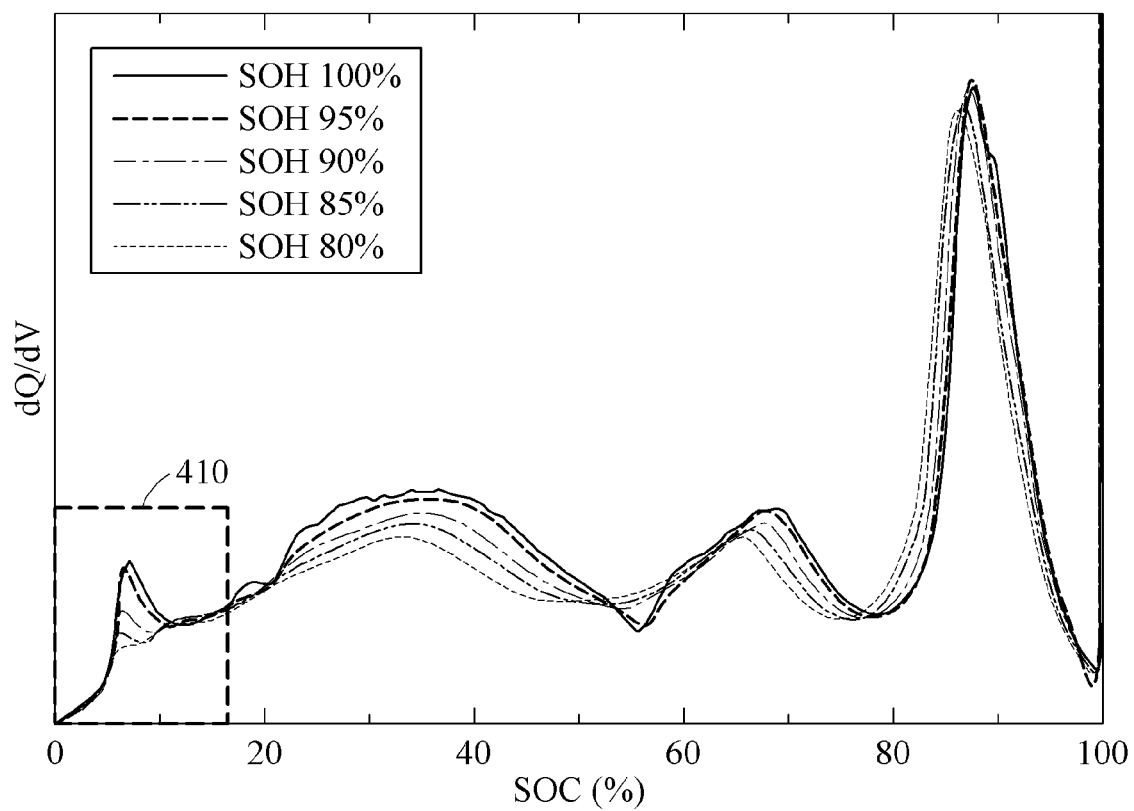

FIGS. 3 and 4 illustrate examples of battery characteristics corresponding to charging levels of a plurality of reference batteries.

As described above, the aging modes of the one or more reference batteries are used to estimate the aging mode of the battery. For this, aging modes and battery characteristics corresponding to charging levels of a plurality of reference batteries are stored in advance in a database.

Each of the plurality of reference batteries have different aging factors and/or different current aging degrees. Thus, each of the plurality of reference batteries have battery characteristics and aging modes corresponding to different charging levels.

The battery charging apparatus selects one or more reference batteries having battery characteristics corresponding to a charging level similar to a battery characteristic corresponding to a charging level of a battery to be charged, from among the plurality of reference batteries. In this example, a similarity is determined based on a peak characteristic shown in a graph of a battery characteristic corresponding to a charging level. The peak characteristic will be described with reference to FIGS. 3 and 4.

FIG. 3 illustrates examples of graphs showing battery characteristics corresponding to charging levels of a 10° C., 10 aged cell. In this example, a main aging factor is estimated to be Li plating. FIG. 4 illustrates examples of graphs showing battery characteristics corresponding to charging levels of a 25° C., 10 aged cell. In this example, main aging factors are estimated to be a cathode capacity decrease and an anode solid electrolyte interphase (SEI) layer.

Referring to the graphs shown in FIGS. 3 and 4, a different graph is represented depending on an SOH despite the same aging temperature, and a different graph is represented depending on an aging temperature despite the same SOH. In particular, different characteristics are shown clearly at peaks of a portion with the lowest SOC (that is, an initial SOC 310, 410), among the peaks included in the graph. That is, the most obvious characteristic differences are shown at the first peaks shown in the graph.

The peak characteristic includes at least one characteristic of a position, an intensity, a full width at half maximum (FWHM), and a shape of a peak appearing in the graph. The position of the peak indicates an SOC value at which the peak occurs. For example, FIG. 3 shows that the position of the peak, that is, the SOC at which the peak occurs, is shifted as the SOH is changed. Conversely, FIG. 4 shows that the position of the peak is relatively less shifted as the SOH is changed. In addition, the intensity of the peak indicates a sharpness of the peak. For example, FIG. 3 or 4 shows that the intensity of the peak relatively weakens as the SOH decreases. Further, the FWHM of the peak indicates a difference between two variable values corresponding to half of the maximum value of the peak. For example, the FWHM of the peak decreases as the peak becomes thinner and sharper. The shape of the peak indicates the form of the peak. For example, the peak is in the form that sharply rises and then gently falls or, conversely, in the form that gently rises and sharply falls.

The battery characteristics corresponding to the charging levels shown in FIGS. 3 and 4 are represented as the graphs of dQ/dV vs. SOC, which are provided for ease of description. Examples are not limited thereto. dV/dQ may be applied instead of dQ/dV of the axis y, and a voltage V or a quantity of electric charge Q may be applied instead of SOC of the axis x.

Figure 5:
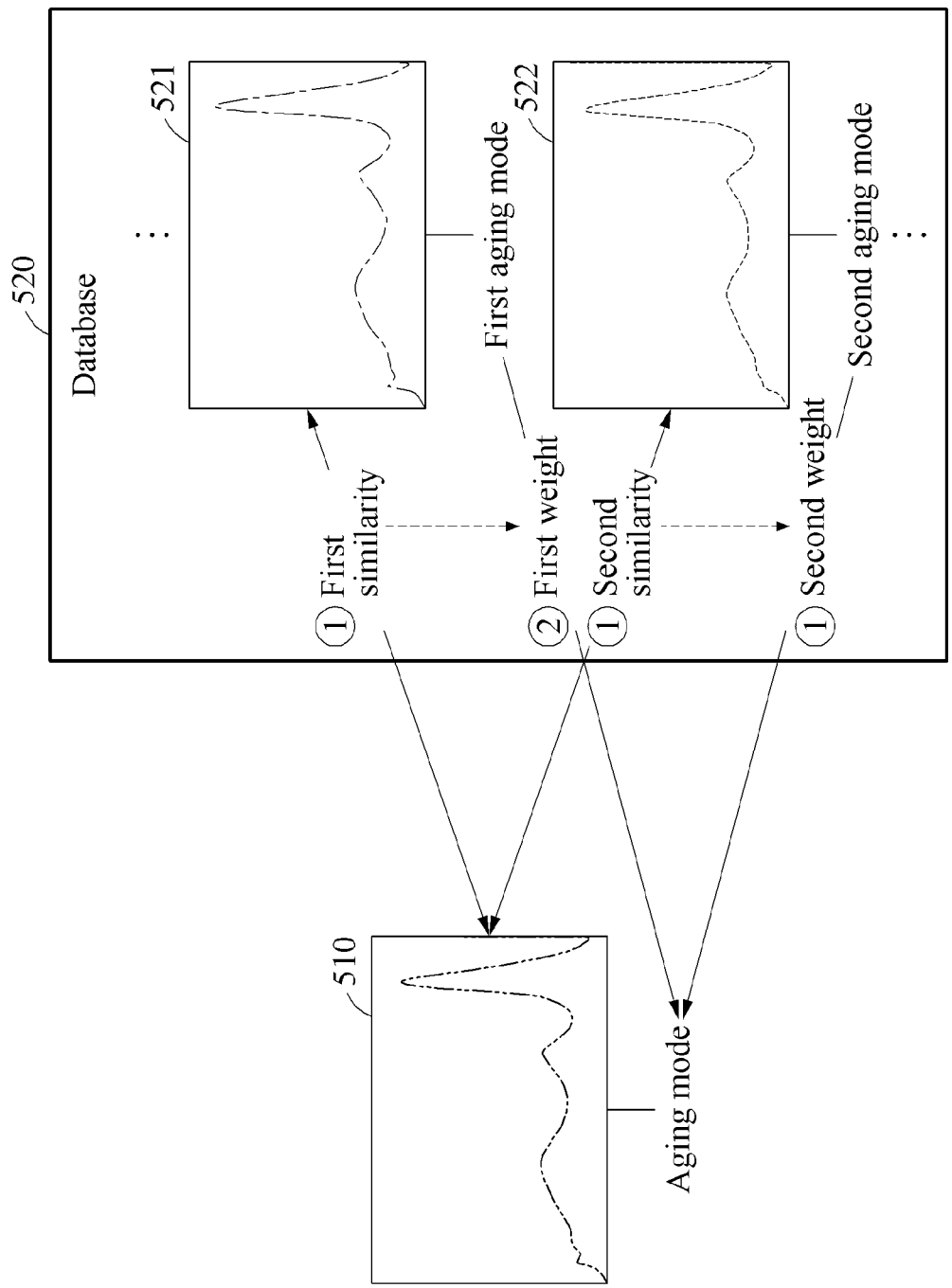
FIG. 5 illustrates an example of estimating an aging mode of a battery.

FIG. 5 illustrates an example of estimating an aging mode of a battery.

Referring to FIG. 5, an example of determining an aging mode of a target battery based on aging modes of one or more reference batteries having battery characteristics corresponding to charging levels, similar to a battery characteristic corresponding to a charging level of the target battery, is illustrated.

In FIG. 5, a graph 510 illustrates a battery characteristic corresponding to a charging level of the target battery, a graph 521 illustrates a battery characteristic corresponding to a charging level of a first reference battery, and a graph 522 illustrates a battery characteristic corresponding to a charging level of a second reference battery.

A database 520 stores aging modes and battery characteristics corresponding to charging levels of a plurality of reference batteries. A battery charging apparatus identifies one or more reference batteries having battery characteristics corresponding to charging levels, similar to the battery characteristic corresponding to the charging level of the target battery, in the database 520. For example, the battery charging apparatus identifies one or more reference batteries having battery characteristics corresponding to charging levels, with similarities greater than or equal to a threshold similarity, with respect to the battery characteristic corresponding to the charging level of the target battery. Further, the battery charging apparatus identifies n reference batteries having battery characteristics corresponding to charging levels, most similar to the battery characteristic corresponding to the charging level of the target battery. In addition, various examples of identifying one or more reference batteries having battery characteristics corresponding to charging levels, similar to the battery characteristic corresponding to the charging level of the target battery, may be applied without limitation.

The battery charging apparatus estimates the aging mode of the target battery by applying a weight determined based on a similarity, to an aging mode of each of the identified one or more reference batteries. The similarity indicates a similarity between a peak characteristic shown in a graph of a battery characteristic corresponding to a charging level of each of the identified reference batteries and a peak characteristic shown in a graph of a battery characteristic corresponding to a charging level of the target battery.

For ease of description, it is assumed in the example of FIG. 5 that the first reference battery and the second reference battery are identified among the plurality of reference batteries in the database 520. In addition, it is assumed that the first reference battery and the second reference battery are batteries aged by various aging factors, for example, Li plating, a cathode capacity decrease, and an anode SEI layer. For example, it is assumed that the first reference battery is a battery aged principally by Li plating, and the second reference battery is a battery aged principally by a cathode capacity decrease and an anode SEI layer.

The battery charging apparatus determines a first similarity between the graph 510 of the target battery and the graph 521 of the first reference battery. In this example, the first similarity is determined based on a similarity to the peak characteristic described above. Similarly, the battery charging apparatus determines a second similarity between the graph 510 of the target battery and the graph 522 of the second reference battery.

The battery charging apparatus determines a first weight to be applied to a first aging mode of the first reference battery based on the first similarity and determines a second weight to be applied to a second aging mode of the second reference battery based on the second similarity. For example, by determining a high weight for a high similarity, a greater portion of an aging mode of a reference battery with a higher similarity is reflected in the aging mode of the target battery.

The battery charging apparatus estimates an aging mode of a battery to be charged based on the first aging mode to which the first weight is applied and the second aging mode to which the second weight is applied, and updates a battery model based on the estimated aging mode.

For example, the battery model is updated to reflect aging occurring in the battery to be charged due to Li plating, a cathode capacity decrease, and an anode SEI layer. If the first weight to be applied to the first aging mode of the first reference battery is 0.7, and the second weight to be applied to the second aging mode of the second reference battery is 0.3, aging by Li plating to be reflected in the battery model is determined by applying 0.7 to the first aging mode indicating Li plating aging occurring in the first reference battery, and applying 0.3 to the second aging mode indicating Li plating aging occurring in the second reference battery. Further, aging by the cathode capacity decrease and the anode SEI layer to be reflected in the battery model is determined by applying 0.7 to the first aging mode indicating cathode capacity decrease and anode SEI layer aging occurring in the first reference battery, and applying 0.3 to the second aging mode indicating cathode capacity decrease and anode SEI layer aging occurring in the second reference battery.

As described above, by estimating the aging mode of the target battery to be charged based on the aging modes of one or more reference batteries having battery characteristics corresponding to charging levels, similar to the battery characteristic corresponding to the charging level of the target battery, it is possible to reflect an aging factor, a history of aging, and a current aging state of the target battery in the battery model based on only battery characteristics corresponding to charging levels derived from a charging profile of the target battery, whereby the battery is quick charged while effectively avoiding aging conditions.

Figure 6:
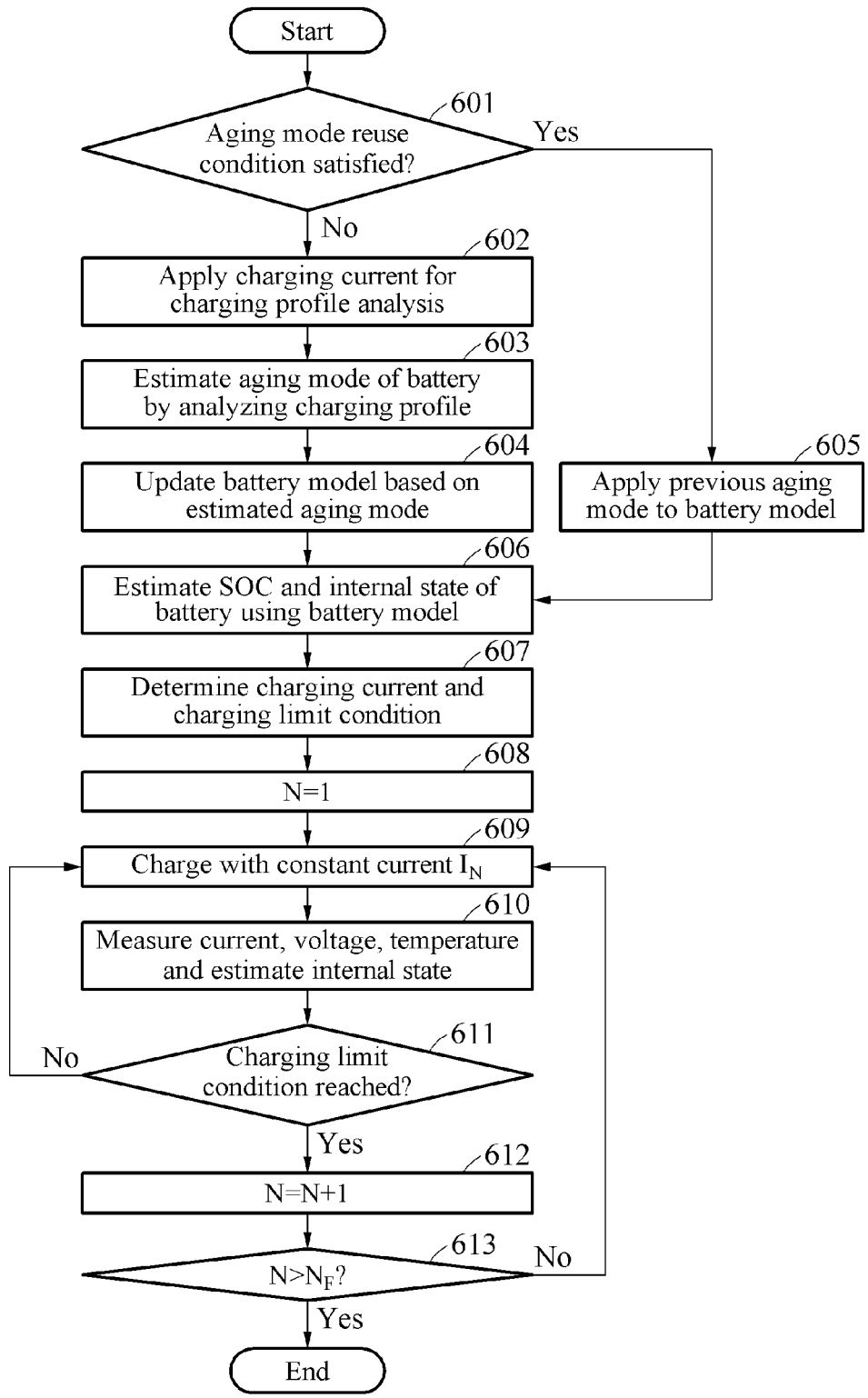
FIG. 6 illustrates an example of charging a battery.

FIG. 6 illustrates an example of charging a battery.

FIG. 6 illustrates a flowchart of an example in which a battery charging apparatus charges a battery.

In operation 601, a battery charging apparatus verifies whether an aging mode reuse condition is satisfied. For example, the reuse condition includes at least one of whether a time difference, between a last point in time at which an aging mode of a battery is estimated and a current point in time, is less than or equal to a threshold time, and whether the usage of the battery after the last point in time is less than or equal to a threshold usage. That is, if the difference between the last point in time at which the aging mode is estimated and the current point in time is not large enough and/or the battery is not used much after the last point in time, the battery is not actually aged in the meantime. Thus, the previously estimated aging mode is used as is.

If the aging mode reuse condition is satisfied, the previous aging mode is applied to a battery model, in operation 605. In this example, operations 602 through 604 are omitted. Conversely, if the aging mode reuse condition is not satisfied, operation 602 is performed next.

In operation 602, the battery charging apparatus applies a charging current for charging profile analysis to the battery.

In operation 603, the battery charging apparatus estimates an aging mode of the battery by analyzing a charging profile. For example, the battery charging apparatus determines a battery characteristic corresponding to a charging level of the battery by analyzing the charging profile, and estimates an aging mode of the battery based on the determined battery characteristic corresponding to the charging level. The above description may also apply hereto, and thus duplicate description will be omitted herein for conciseness.

In operation 604, the battery charging apparatus updates the battery model based on the estimated aging mode.

In operation 606, the battery charging apparatus estimates an SOC and an internal state of the battery using the updated battery model. Here, the internal state includes an anode overpotential, a cathode overpotential, an anode surface Li ion concentration, a cathode surface Li ion concentration, a cell voltage condition, a charging state, and temperature of the battery.

In operation 607, the battery charging apparatus determines a charging current and a charging limit condition. Here, the charging limit condition is a condition for dividing a process of charging the battery into a plurality of charging steps to charge the battery within the range in which aging of the battery is prevented, according to a multi-step charging method. For example, the charging limit condition is set for any one or any combination of a charging time, a voltage, a current, temperature, and an internal state of the battery. The charging current is a current for charging the battery in each charging step, and is expressed as A, mA, or C-rate.

In operation 608, the battery charging apparatus sets a charging step N to "1".

In operation 609, the battery charging apparatus charges the battery with a charging current IN corresponding to a constant current.

In operation 610, the battery charging apparatus measures any one or any combination of the current, the voltage, and the temperature of the battery, and estimates the internal state of the battery based on the measured value(s) and the battery model, for example, an electrochemical model.

In operation 611, the battery charging apparatus determines whether the charging termination condition determined in operation 607 is reached. For example, the battery charging apparatus determines whether the charging limit condition is reached by the measured value(s), such as the charging time, the voltage, the current, and the temperature of the battery, and/or the estimated value(s), such as the internal state of the battery. If the charging limit condition is not reached, operation 609 is performed next. Conversely, if the charging limit condition is reached, operation 612 is performed next.

In operation 612, the battery charging apparatus increases the charging step N by "1".

In operation 613, the battery charging apparatus determines whether the charging step N exceeds a predetermined final charging step $N_F$. If the charging step N does not exceed the final charging step $N_F$, operation 609 is performed next. Conversely, if the charging step N exceeds the final charging step $N_F$, the battery charging operation is terminated.

Charging of the battery may be terminated in response to another charging termination event. For example, the battery charging apparatus may terminate charging of the battery, if the voltage of the battery reaches a threshold voltage. The threshold voltage may be in the range of 4V to 4.2V. In another example, the battery charging apparatus may charge the battery with a constant voltage if the voltage of the battery reaches the threshold voltage, and terminate charging of the battery if the current of the battery reaches a termination current, for example, 0.05 C-rate.

Figure 7:
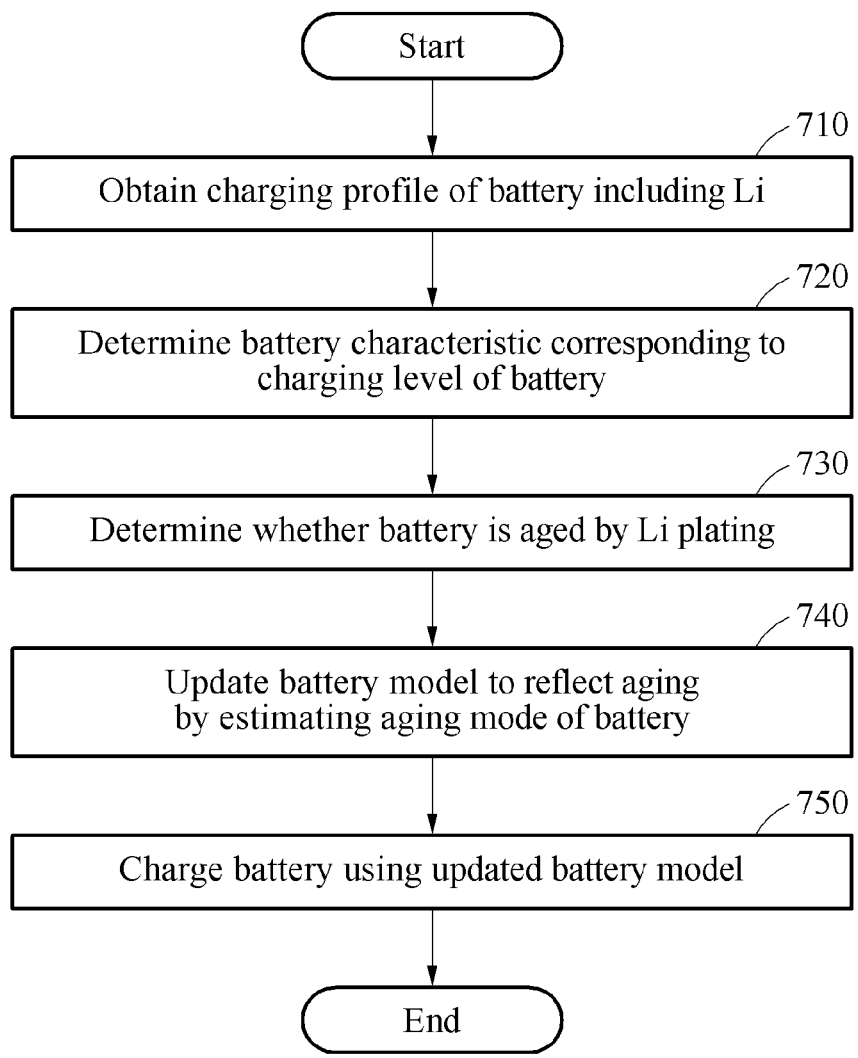
FIG. 7 illustrates an example of a battery charging method.

FIG. 7 illustrates an example of a battery charging method.

Referring to FIG. 7, a battery charging method performed by a processor of a battery charging apparatus is illustrated.

In operation 710, the battery charging apparatus obtains a charging profile of a battery including Li.

In operation 720, the battery charging apparatus determines a battery characteristic corresponding to a charging level of the battery based on the charging profile.

In operation 730, the battery charging apparatus determines whether the battery is aged by Li plating, based on the battery characteristic corresponding to the charging level. If a battery characteristic corresponding to a charging level of a reference battery aged principally by Li plating, among a plurality of reference batteries having different aging factors and/or different aging degrees, is most similar to the battery characteristic corresponding to the charging level of the battery, the battery charging apparatus determines that the battery is aged by Li plating.

In operation 740, the battery charging apparatus updates a battery model to reflect aging of the battery by estimating an aging mode of the battery, in response to determination that the battery is aged by Li plating. The battery charging apparatus estimates the aging mode of the battery based on an aging mode of the reference battery aged principally by Li plating, and updates the battery model based on the estimated aging mode.

In operation 750, the battery charging apparatus charges the battery using the updated model. The battery charging apparatus determines a charging condition of the battery using the updated battery model, and charges the battery based on the determined charging condition.

The description provided with reference to FIGS. 1 through 6 also applies to the operations of FIG. 7, and thus duplicated description will be omitted for conciseness.

Figure 8:
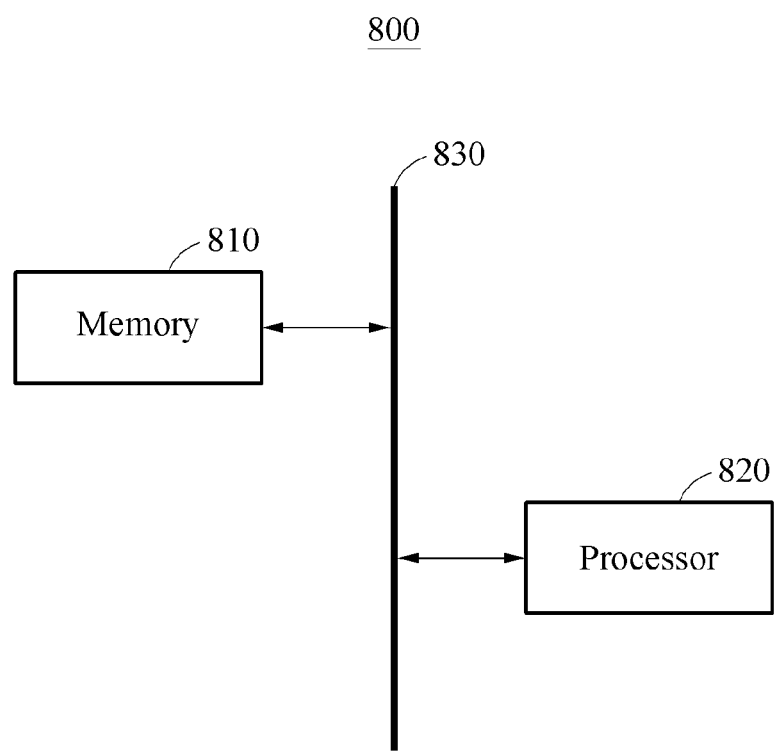
FIG. 8 illustrates an example of a battery charging apparatus.

FIG. 8 illustrates an example of a battery charging apparatus.

Referring to FIG. 8, a battery charging apparatus 800 includes a memory 810 and a processor 820. The memory 810 and the processor 820 communicate with each other through a bus 830. The battery charging apparatus 800 is provided in various electronic devices including a battery, such as for example, a vehicle, a terminal and a walking assistance device.

The memory 810 stores computer-readable instructions. When the instructions stored in the memory 810 are executed by the processor 820, the processor 820 performs the operations described above. The memory 810 is a volatile memory or a non-volatile memory.

The processor 820 is a device configured to execute the instructions or programs, or control the battery charging apparatus 800. The processor 820 estimates an aging mode of the battery reflecting an aging factor and an aging degree of the battery based on a battery characteristic corresponding to a charging level of the battery, updates a battery model based on the aging mode, and controls charging of the battery using the updated battery model.

For example, the battery charging apparatus 800 processes the operations described above.

Figure 9:
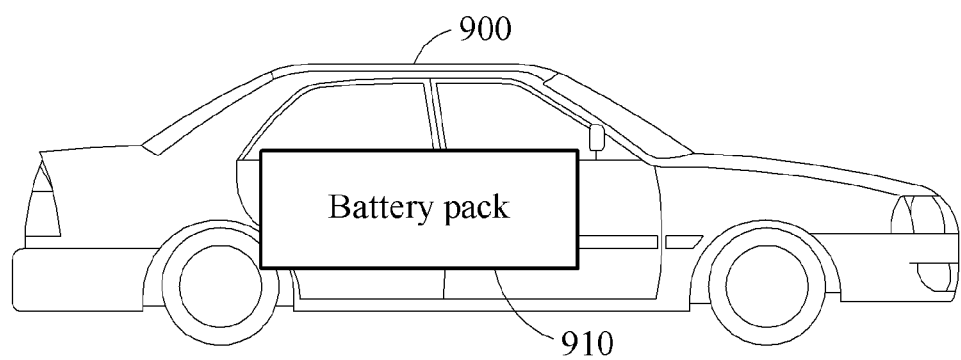
FIG. 9 illustrates an example of a vehicle.

FIG. 9 illustrates an example of a vehicle.

Referring to FIG. 9, a vehicle 900 includes a battery pack 910. The vehicle 900 is a vehicle using the battery pack 910 as power. The vehicle 900 is, for example, an electrical vehicle or a hybrid vehicle.

The battery pack 910 includes a battery management system (BMS) and battery cells (or battery modules). The BMS monitors whether an abnormality occurs in the battery pack 910, and prevents over-charging or over-discharging of the battery pack 910. Further, the BMS performs thermal control with respect to the battery pack 910 if the temperature of the battery pack 910 exceeds a first temperature, for example, 40° C., or is less than a second temperature, for example, −10° C. In addition, the BMS equalizes charging states between the battery cells in the battery pack 910 by performing cell balancing.

The vehicle 900 includes a battery charging apparatus. The battery charging apparatus updates a battery model based on an aging mode reflecting an aging factor and an aging degree of the battery pack 910 (or the battery cells in the battery pack 910), and charges the battery pack 910 (or the battery cells in the battery pack 910) using the updated battery model.

The description provided with reference to FIGS. 1 through 8 also applies to the example of FIG. 9, and thus duplicated description will be omitted for conciseness.

Figure 10:
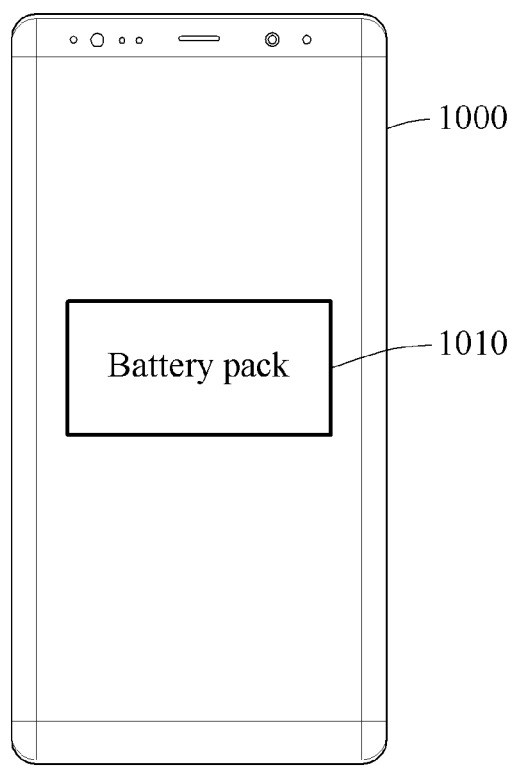
FIG. 10 illustrates an example of a mobile device.

FIG. 10 illustrates an example of a mobile device.

Referring to FIG. 10, a mobile device 1000 includes a battery pack 1010. The mobile device 1000 is a device using the battery pack 1010 as power. The mobile device 1000 is a portable terminal, for example, a smart phone. The battery pack 1010 includes a BMS and battery cells (or battery modules).

The mobile device 1000 includes a battery charging apparatus. The battery charging apparatus updates a battery model based on an aging mode reflecting an aging factor and an aging degree of the battery pack 1010 (or the battery cells in the battery pack 1010), and charges the battery pack 1010 (or the battery cells in the battery pack 1010) using the updated battery model.

The description provided with reference to FIGS. 1 through 9 also applies to the example of FIG. 10, and thus duplicated description will be omitted for conciseness.

Figure 11:
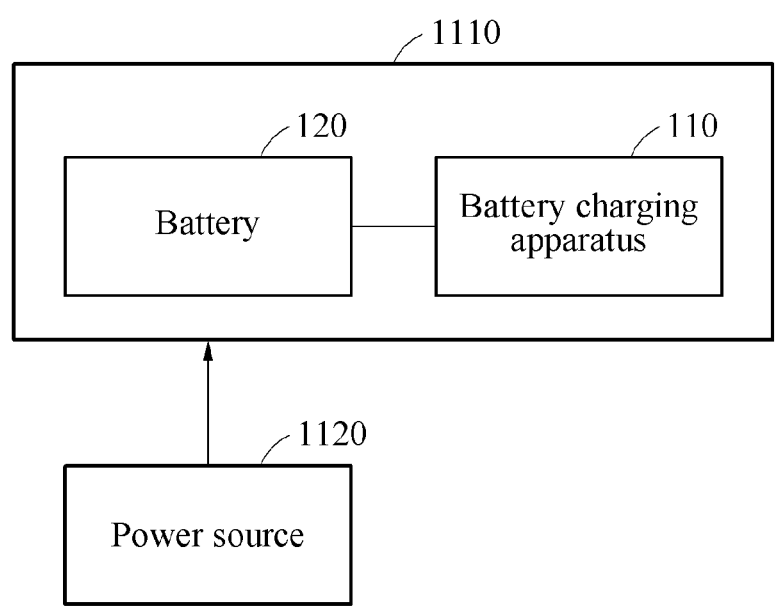
FIG. 11 illustrates an example of a terminal.

FIG. 11 illustrates an example of a terminal.

Referring to FIG. 11, a terminal 1110 includes the battery charging apparatus 110 and the battery 120. The terminal 1110 is a mobile terminal, such as a smart phone, a notebook, a tablet PC or a wearable device. However, examples are not limited thereto.

The battery charging apparatus 110 is provided in the form of an integrated circuit (IC). However, examples are not limited to such a configuration.

The battery charging apparatus 110 receives power in a wired or wireless manner from a power source 1120, and charges the battery 120 using the power. The battery charging apparatus 110 updates a battery model based on an aging mode reflecting an aging factor and an aging degree of the battery 120, and charges the battery 120 using the updated battery model.

The description provided with reference to FIGS. 1 through 10 also applies to the example of FIG. 11, and thus duplicated description will be omitted for conciseness.

The battery charging apparatuses 110 and 800, and other apparatuses, units, modules, devices, and other components described herein with respect to FIGS. 1-11 are implemented by hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-11 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and providing the instructions or software and any associated data, data files, and data structures to a processor or computer so that the processor or computer can execute the instructions.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method of charging a target battery, the method comprising:
    first charging a target battery using a battery model;
    determining, by comparing a battery characteristic corresponding to a charging level of the target battery with respective stored battery characteristics corresponding to charging levels of a plurality of reference batteries, an aging mode of the target battery that reflects an aging factor and an aging degree of the target battery;
    updating, based on the determined aging mode, the battery model to reflect the aging mode of the target battery; and
    second charging the target battery using the updated battery model,
    wherein each of the respective stored battery characteristics corresponds to a reference aging mode of a corresponding reference battery and represents respective information with respect to a charging level, a change in quantity of electric charge, and a change in voltage of the corresponding reference battery;
    the determining of the aging mode further comprises:
        applying a respective weight to each one or more stored battery characteristics among the respective stored battery characteristics;
        and determining each of the respective weights based on a corresponding similarity between the battery characteristic corresponding to the charging level of the target battery and the one or more stored battery characteristics;
    wherein, for each of the one or more stored battery characteristic, the corresponding similarity indicates a similarity of a peak characteristic in a graphing of a battery characteristic corresponding to the charging level of a corresponding reference battery to a peak characteristic in a graphing of the battery characteristic corresponding to the charging level of the target battery.

2. The method of claim 1, wherein the plurality of reference batteries have different aging factors and/or different aging degrees.

3. The method of claim 1, wherein the peak characteristic includes at least one characteristic of a position, an intensity, a full width at half maximum (FWHM), and a shape of a peak in the graphing of the battery characteristic corresponding to the charging level.

4. The method of claim 1, wherein the peak characteristic is a characteristic of a peak with a lowest charging level, among peaks included in the graphing of the battery characteristic corresponding to the charging level.

5. The method of claim 1, wherein the aging mode indicates:
    the aging factor of the target battery aged by an aging history of the target battery; and
    a current aging degree of the target battery aged by the aging factor.

6. The method of claim 1, wherein the battery characteristic corresponding to the charging level corresponds to dQ/dV with respect to a state of charge (SOC), and
    wherein dQ is a change in quantity of electric charge of the target battery, and dV is a change in voltage of the target battery.

7. The method of claim 1, wherein the second charging includes charging the target battery using multi-step charging determined based on the updated battery model.

8. The method of claim 1, further comprising determining the battery characteristic corresponding to the charging level based on a charging profile of the target battery.

9. The method of claim 1, wherein the updating of the battery model includes updating the battery model to reflect the aging factor and the aging degree of the target battery corresponding to the aging mode in an internal state of the battery model.

10. The method of claim 1, wherein the target battery is a battery cell, a battery module, or a battery pack.

11. The method of claim 1, wherein the battery model is an electrochemical model.

12. A non-transitory computer-readable storage medium storing instructions that, when executed by a processor, cause the processor to perform the method of claim 1.

13. The method of claim 1, wherein the battery characteristic corresponding to the charging level is expressed by a graphing of the ratio between the change in quantity of electric charge and a change in voltage of the target battery, and the charging level of the target battery.

14. The method of claim 13, wherein the charging level of the target battery includes one of a state of charge (SOC), a voltage, and a quantity of electric charge of the target battery.

15. The method of claim 1, wherein the determining of the aging mode comprising determining an aging mode previously estimated with respect to the target battery to be the aging mode of the target battery, in response to an aging mode reuse condition being satisfied.

16. The method of claim 15, wherein the determining of whether the aging mode reuse condition is satisfied includes one or both of:
determining whether a time difference, between a last point in time at which the aging mode of the target battery was estimated and a current point in time, is less than or equal to a threshold time; and
determining whether the usage of the target battery, after the last point in time, is less than or equal to a threshold usage.

17. An apparatus for charging a target battery, the apparatus comprising:
a memory configured to store a battery model; and
a processor configured to:
control a first charging of the target battery using the battery model;
determine, by comparing a battery characteristic corresponding to a charging level of the target battery with respective stored battery characteristics corresponding to charging levels of one or more a plurality of reference batteries, an aging mode of the target battery that reflects an aging factor and an aging degree of the target battery;
update, based on the determined aging mode, the battery model to reflect the aging mode of the target battery; and
control second charging of the target battery using the updated battery model,
wherein each of the respective stored battery characteristics corresponds to a reference aging mode of a corresponding reference battery and represents respective information with respect to a charging level, change in quantity of electric charge, and a change in voltage of the corresponding reference battery;
the determining of the aging mode further comprises:
applying a respective weight to each one or more stored battery characteristics among the respective stored battery characteristics;
and determining each of the respective weights based on a corresponding similarity between the battery characteristic corresponding to the charging level of the target battery and the one or more stored battery characteristics;
wherein for each of the one or more stored battery characteristic, the corresponding similarity indicates a similarity of a peak characteristic in a graphing of a battery characteristic corresponding to the charging level of a corresponding reference battery to a peak characteristic in a graphing of the battery characteristic corresponding to the charging level of the target battery.

18. The apparatus of claim 17, wherein the plurality of reference batteries have different aging factors and/or different aging degrees.

19. A method comprising:
first charging a target battery using a battery model;
determining a characteristic of a reference battery as an aging mode of a target battery that reflects an aging factor and an aging degree of the target battery, by comparing one or more characteristics of the target battery with respective stored battery characteristics corresponding to charging levels of a first reference battery and a second reference battery, the first and second reference batteries have been aged principally by different aging factors;
updating, based on the determined aging mode, the battery model; and
second charging the target battery using the battery model,
wherein, for each of the first reference battery and the second reference battery, each of the respective stored battery characteristics corresponds to a reference aging mode of a corresponding reference battery and represents respective information with respect to a charging level, a change in quantity of electric charge, and a change in voltage of the reference battery;
the determining of the aging mode further comprises:
applying a respective weight to each one or more stored battery characteristics among the respective stored battery characteristics;
and determining each of the respective weights based on a corresponding similarity between the battery characteristic corresponding to the charging level of the target battery and the one or more stored battery characteristics;
wherein for each of the one or more stored battery characteristic, the corresponding similarity indicates a similarity of a peak characteristic in a graphing of a battery characteristic corresponding to the charging level of a corresponding reference battery to a peak characteristic in a graphing of the battery characteristic corresponding to the charging level of the target battery.

20. The method of claim 19, wherein the first reference battery has been aged by an aging factor most similar to an aging factor of Li plating among the different aging factors, and the second reference battery that has been aged by an aging factor most similar to an aging factor of a cathode capacity decrease and an anode solid electrolyte interphase (SEI) layer among the different aging factors.

21. A method comprising:
first charging a target battery using a battery model;
obtaining a charging profile of a target battery including lithium (Li);
determining, by comparing a battery characteristic corresponding to a charging level of the target battery with respective stored battery characteristics corresponding to charging levels of a plurality of reference batteries, an aging mode of the target battery that reflects an aging factor and an aging degree of the target battery;
determining, based on the determined battery characteristic to the charging level of the target battery, whether the target battery is aged by Li plating;
updating, in response to a determination that the target battery is aged by Li plating, the battery model to reflect the aging of the target battery; and
second charging the target battery using the updated battery model,
wherein each of the respective stored battery characteristics corresponds to a reference aging mode of a corresponding reference battery and represents respective information with respect to a charging level, a change in quantity of electric charge, and a change in voltage of the corresponding reference battery;
the determining of the aging mode further comprises:
applying a respective weight to each one or more stored battery characteristics among the respective stored battery characteristics;

and determining each of the respective weights based on a corresponding similarity between the battery characteristic corresponding to the charging level of the target battery and the one or more stored battery characteristics;

wherein for each of the one or more stored battery characteristic, the corresponding similarity indicates a similarity of a peak characteristic in a graphing of a battery characteristic corresponding to the charging level of a corresponding reference battery to a peak characteristic in a graphing of the battery characteristic corresponding to the charging level of the target battery.

22. The method of claim 21, wherein the determining of the target battery is aged by Li plating comprising:
determining, when a reference battery is principally aged by Li plating, among the plurality of reference batteries having different aging factors and/or different aging degrees, whether the reference battery has a battery characteristic most similar to the battery characteristic corresponding to the charging level of the target battery.

23. The method of claim 21, wherein the determining of the aging mode of the target battery comprising using a reference aging mode of a reference battery aged principally by Li plating, and updating the battery model based on the determined aging mode.

24. The method of claim 21, further comprising:
determining, using the updated battery model, a charging condition of the target battery, and
wherein the second charging includes charging, based on the determined charging condition, the target battery based on the determined charging condition.

25. The method of claim 21, wherein the battery model is an electrochemical model.

26. The method of claim 25, further comprising updating the electrochemical model by reflecting a decrease in Li capacity at a cathode by Li plating.

* * * * *